US008553396B2

(12) United States Patent
Chiu et al.

(10) Patent No.: US 8,553,396 B2
(45) Date of Patent: Oct. 8, 2013

(54) COMMUNICATIONS DEVICE CAPABLE OF COUPLING CURRENT REDUCTION

(75) Inventors: Chieh-Ping Chiu, Tianwei (TW); Feng-Jen Weng, Tao Yuan Shien (TW); Hsiao-Wei Wu, Zhongli (TW); I-Ping Yen, New Taipei (TW)

(73) Assignee: Quanta Computer, Inc., Tao Yuan Hsien (TW)

( * ) Notice: Subject to any disclaimer, the term of this patent is extended or adjusted under 35 U.S.C. 154(b) by 429 days.

(21) Appl. No.: 13/085,821

(22) Filed: Apr. 13, 2011

(65) Prior Publication Data

US 2012/0075780 A1 Mar. 29, 2012

(30) Foreign Application Priority Data

Sep. 28, 2010 (TW) ............................... 99132764 A

(51) Int. Cl.
*H05K 5/00* (2006.01)

(52) U.S. Cl.
USPC ... 361/679.01; 361/752; 361/753; 455/575.1; 455/575.4; 455/574

(58) Field of Classification Search
USPC ............... 361/752–756, 679.01, 679.27, 814; 455/575.1–575.4, 574
See application file for complete search history.

(56) References Cited

U.S. PATENT DOCUMENTS

| | | | | |
|---|---|---|---|---|
| 7,366,554 | B2 * | 4/2008 | Hayes | 455/575.5 |
| 7,371,090 | B2 * | 5/2008 | Hashizume | 439/164 |
| 7,414,855 | B1 * | 8/2008 | Arnold | 361/752 |
| 7,505,278 | B2 * | 3/2009 | Choi et al. | 361/749 |
| 8,369,910 | B2 * | 2/2013 | Kim | 455/575.4 |

* cited by examiner

*Primary Examiner* — Jayprakash N Gandhi
*Assistant Examiner* — Hung Dang
(74) *Attorney, Agent, or Firm* — Brinks Hofer Gilson & Lione

(57) ABSTRACT

A communications device capable of coupling current reduction includes a first casing, a second casing, and an antenna. The first casing includes a first metal layer part. The second casing includes a second metal layer part. The antenna is adjacent to the first and second metal layer parts when the second casing is at a covering position. The first metal layer part has a surface that confronts the second metal layer part when the second casing is at the covering position and that is formed with a plurality of first recesses. The second metal layer part has a surface that confronts the first metal layer part when the second casing is at the covering position and that is formed with a plurality of second recesses.

10 Claims, 8 Drawing Sheets

849 MHz
Efficiency = -8.7 dB,Gain = -5.4 dBi @(120,170)

H Plane(X-Y Cut, $\theta$ =90)

Peak= -1.5 dBi, Avg = -2.2dBi

E1 Plane(Z-X Cut, ϕ =0)

Peak= -5.4 dBi, Avg = -9.4dBi

E2 Plane(Y-Z Cut, ϕ =90)

Peak= -5.9 dBi, Avg = -9.4dBi

COMMUNICATIONS DEVICE CAPABLE OF COUPLING CURRENT REDUCTION

CROSS-REFERENCE TO RELATED APPLICATION

This application claims priority of Taiwanese Application No. 099132764, filed on Sep. 28, 2010.

BACKGROUND OF THE INVENTION

1. Field of the Invention

The present invention relates to a communications device, more particularly to a communications device capable of coupling current reduction.

2. Description of the Related Art

Referring to FIG. 1, a portable communications device 9, such as a mobile phone or a notebook computer, includes a first casing 92, and a second casing 91 coupled movably to the first casing 92 via a pivot joint. The second casing 91 is movable relative to the first casing 92 between a covering position and an uncovering position. The second casing 91 is provided with a display. The first casing 92 has a surface provided with keys, etc. A circuit board (not shown) for circuit layout is disposed in the first casing 92, and a hidden antenna 93 is disposed on the circuit board and adjacent to the pivot joint.

According to demands for miniaturization and large screen of the portable communications device 9, metallic materials such as aluminum magnesium alloy have been generally adopted to replace thicker plastic material as casing structures. However, the metallic materials bring about communications problems.

Referring to FIG. 2, the first and second casings 92, 91 adopt a design involving metallic materials. When the second casing 91 is at the covering position, a two-layer metal structure will result in coupling current such that communication through the antenna 93 is affected. For example, the two very-close (0.15 mm apart) metal layers act like a capacitor structure, and thus results in undesired coupling current and a decrease in gain of the antenna 93.

SUMMARY OF THE INVENTION

Therefore, an object of the present invention is to provide a communications device capable of coupling current reduction while maintaining structural strength.

Accordingly, the communications device of the present invention includes a first casing, a second casing, and an antenna.

The second casing is coupled movably to the first casing, and the second casing is movable relative to the first casing between a covering position and an uncovering position. The antenna is disposed in one of the first and second casings.

The first casing includes a first metal layer part, the second casing includes a second metal layer part, and the antenna is adjacent to the first and second metal layer parts when the second casing is at the covering position.

The first metal layer part has a surface that confronts the second metal layer part when the second casing is at the covering position and that is formed with a plurality of first recesses.

The second metal layer part has a surface that confronts the first metal layer part when the second casing is at the covering position and that is formed with a plurality of second recesses.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
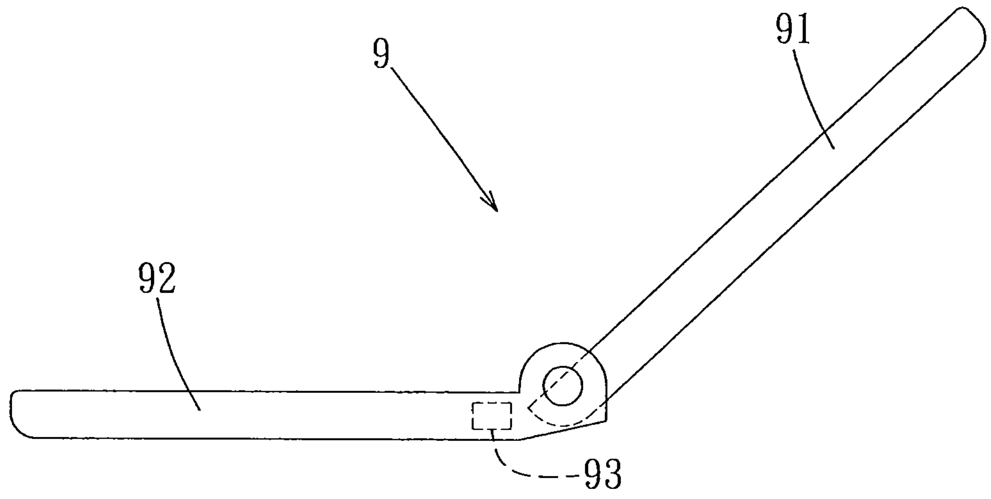
FIG. 1 PRIOR ART
FIG. 1 is a schematic view illustrating an uncovering state of a conventional portable communications device.
Figure 2:
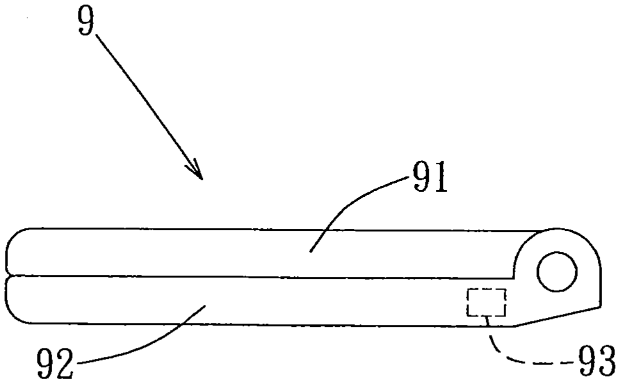
FIG. 2 PRIOR ART
FIG. 2 is a is a schematic view illustrating a covering state of the conventional portable communications device.

Before the present invention is described in greater detail with reference to the preferred embodiments, it should be noted that the same reference numerals are used to denote the same elements throughout the following description.

Figure 3:
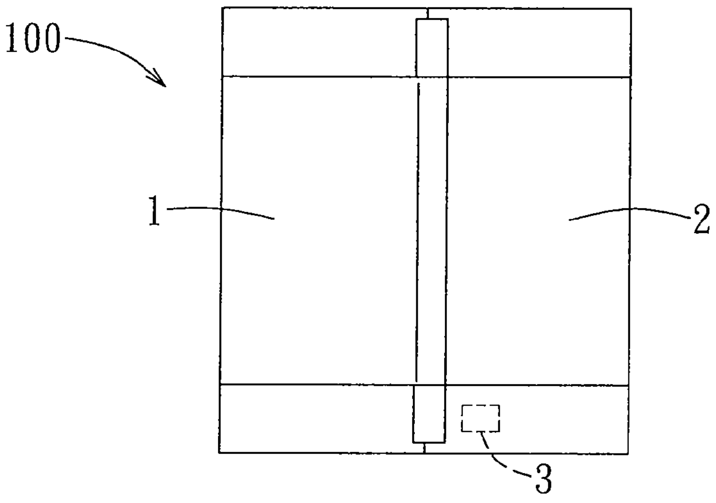
FIG. 3 is a schematic view illustrating an uncovering state of a communications device of a preferred embodiment of the present invention.
Figure 4:
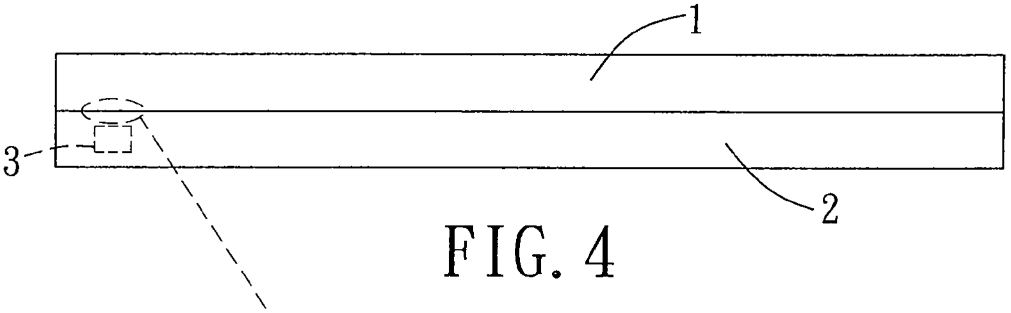
FIG. 4 is a schematic view illustrating a covering state of the preferred embodiment of the present invention.

Referring to FIG. 3 and FIG. 4, a preferred embodiment of a communications device 100 of the present invention is illustrated. The communications device 100 is a foldable electronic product, such as a mobile phone or a notebook computer. The communications device 100 includes a first casing 2, a second casing 1, and an antenna 3. The second casing 1 is coupled movably to the first casing 2, and the second casing 1 is movable relative to the first casing 2 between an uncovering position (FIG. 3) and a covering position (FIG. 4). The antenna 3 is disposed in the first casing 2.

Figure 4A:
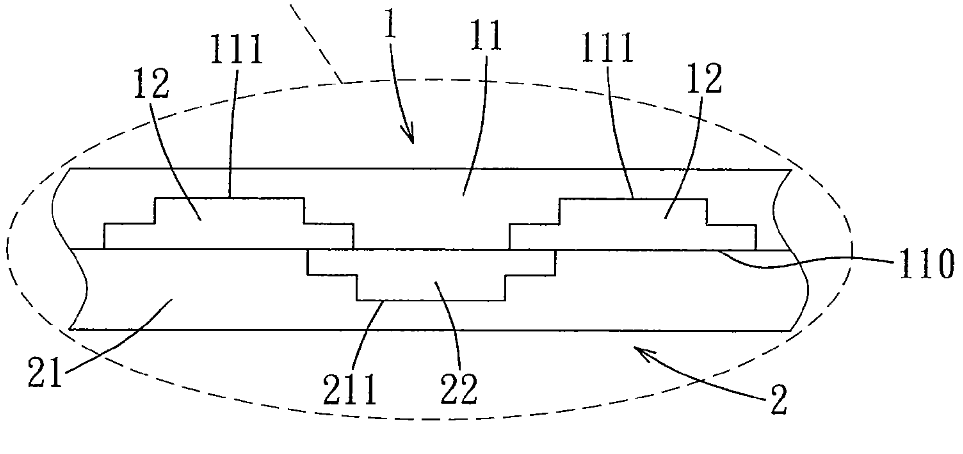
FIG. 4*a* is an enlarged schematic diagram of an encircled portion of the communications device in FIG. 4.

Referring to FIG. 4*a*, the first casing 2 includes a first metal layer part 21, and the second casing 1 includes a second metal layer part 11. In this embodiment, the first metal layer part 21 and the second metal layer part 11 are metallic materials such as aluminum magnesium alloy. The antenna 3 is adjacent to the first and second metal layer parts 21, 11 when the second casing 1 is at the covering position. The first metal layer part 21 has a surface that confronts the second metal layer part 11 when the second casing 1 is at the covering position and that is formed with a plurality of first recesses 211. The second metal layer part 11 has a surface that confronts the first metal layer part 21 when the second casing 1 is at the covering position and that is formed with a plurality of second recesses 111.

In this embodiment, each of the first and second recesses 211, 111 has outer and inner sections respectively proximate to and distal from the surface of the corresponding one of the first and second metal layer parts 21, 11. The outer section is wider than the inner section. Furthermore, geometric centers of adjacent ones of the first recesses 211 are spaced apart by a distance not more than 0.25λ of a frequency at which the antenna 3 operates, in which λ is a wavelength of signals at the frequency (24 mm in this embodiment), and geometric centers of adjacent ones of the second recesses 111 are spaced apart by a distance not more than 0.25λ of the frequency (24 mm in this embodiment).

Each of the first and second recesses 211, 111 has a depth preferred to be the maximum allowable permitted by industrial design and material engineering (3 mm in this embodiment).

Specifically, a small clearance 110 is formed between the first casing 2 and the second casing 1 when the second casing 1 is at the covering position. The first recesses 211 are staggered relative to the second recesses 111 along the clearance 110 when the second casing 1 is at the covering position.

Moreover, the first casing 2 further includes a plurality of solid first non-metallic fillers 22, each filling a respective one of the first recesses 211, and each being flush with the surface of the first metal layer part 21. The second casing 1 further includes a plurality of solid second non-metallic fillers 12, each filling a respective one of the second recesses 111, and each being flush with the surface of the second metal layer part 11. In this embodiment, the first and second non-metallic fillers 22, 12 are plastic or ceramic.

Since the first recesses 211 are staggered relative to the second recesses 111, the first metal layer part 21 is spaced apart from the second metal layer part 11 by the first and second non-metallic fillers 22, 12, when the second casing 1 is at the covering position, such that coupling current is reduced and an adverse affect on communication through the antenna 3 when the first casing 2 is at the covering position is alleviated. Moreover, the first non-metallic fillers 22 can cooperate with the first metal layer part 21 for maintaining structural strength of the first casing 2. Similarly, the second non-metallic fillers 12 can cooperate with the second metal layer part 11 for maintaining structural strength of the second casing 1.

Radiation efficiencies of the communications device 100 with a design of staggered recesses and without the design of staggered recesses at different operating frequencies are illustrated in Table 1 below. It may be deduced from Table 1 that the radiation efficiency of the communications device 100 with the design of staggered recesses of the present invention (each of the first and second recesses 211, 111 having a depth of about 3 mm) is increased by about 3 dB compared with a conventional communications device without the design of staggered recesses (the first and second metal layer parts having a distance of about 0.15 mm therebetween at the covering state).

TABLE 1

| Frequency (MHz) | With staggered recesses Radiation efficiency (dB) | Without staggered recesses Radiation efficiency (dB) |
|---|---|---|
| 824 | −4.09 | −9.86 |
| 836.6 | −3.79 | −9.26 |
| 849 | −3.72 | −8.72 |
| 869 | −4.67 | −8.39 |
| 881.6 | −5.63 | −8.53 |
| 880 | −5.77 | −8.56 |
| 894 | −6.89 | −8.83 |
| 1710 | −3.78 | −6.73 |
| 1747.8 | −2.61 | −5.14 |
| 1785 | −2.20 | −4.84 |
| 1805 | −1.99 | −4.87 |
| 1842.8 | −1.85 | −5.39 |
| 1850 | −1.78 | −5.32 |
| 1880 | −1.85 | −4.99 |
| 1910 | −2.17 | −5.16 |
| 1920 | −2.26 | −5.43 |
| 1930 | −2.27 | −5.51 |
| 1950 | −2.49 | −5.31 |
| 1960 | −2.55 | −5.27 |
| 1980 | −2.93 | −5.63 |
| 1990 | −2.99 | −5.91 |

Other configurations of the preferred embodiment are disclosed hereinafter.

Figure 5:
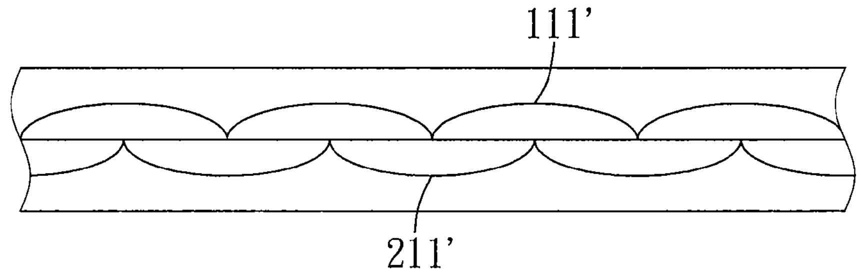
FIG. 5 is a schematic diagram illustrating a plurality of first and second recesses each in a shape of a concave recess.

Referring to FIG. 5, each of the first and second recesses 211', 111' is a concave recess.

Figure 6:
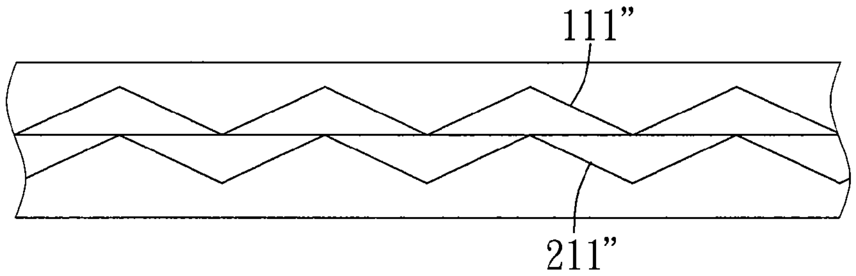
FIG. 6 is a schematic diagram illustrating the first and second recesses each in a shape of a recess defined by a vee wall.

Referring to FIG. 6, each of the first and second recesses 211", 111" is a recess defined by a vee wall.

Figure 7:
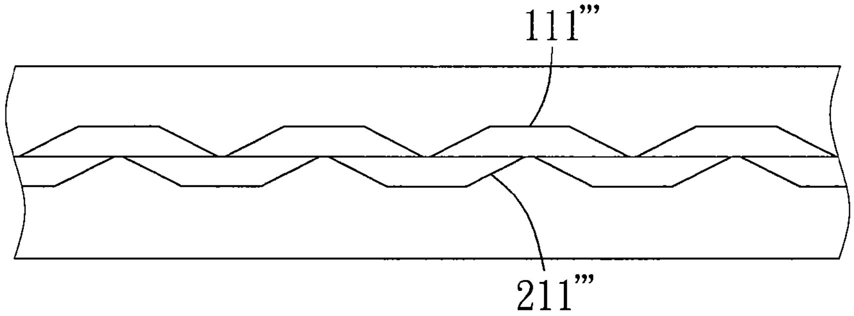
FIG. 7 is a schematic diagram illustrating the first and second recesses each in a shape of a recess defined by a substantially flat recess bottom and two inclined recess walls on opposite sides of the recess bottom.

Referring to FIG. 7, each of the first and second recesses 211'", 111'" is a recess defined by a substantially flat recess bottom and two inclined recess walls on opposite sides of the recess bottom.

Specifically, shapes of the first and second recesses 211, 111 described above are non-limiting examples of the present invention. Those skilled in the art may readily appreciate other suitable forms of the first and second recesses 211, 111 for spacing the first metal layer part 21 apart from the second metal layer part 11, while maintaining structural strengths of the first and second casings 2, 1.

Figure 8:
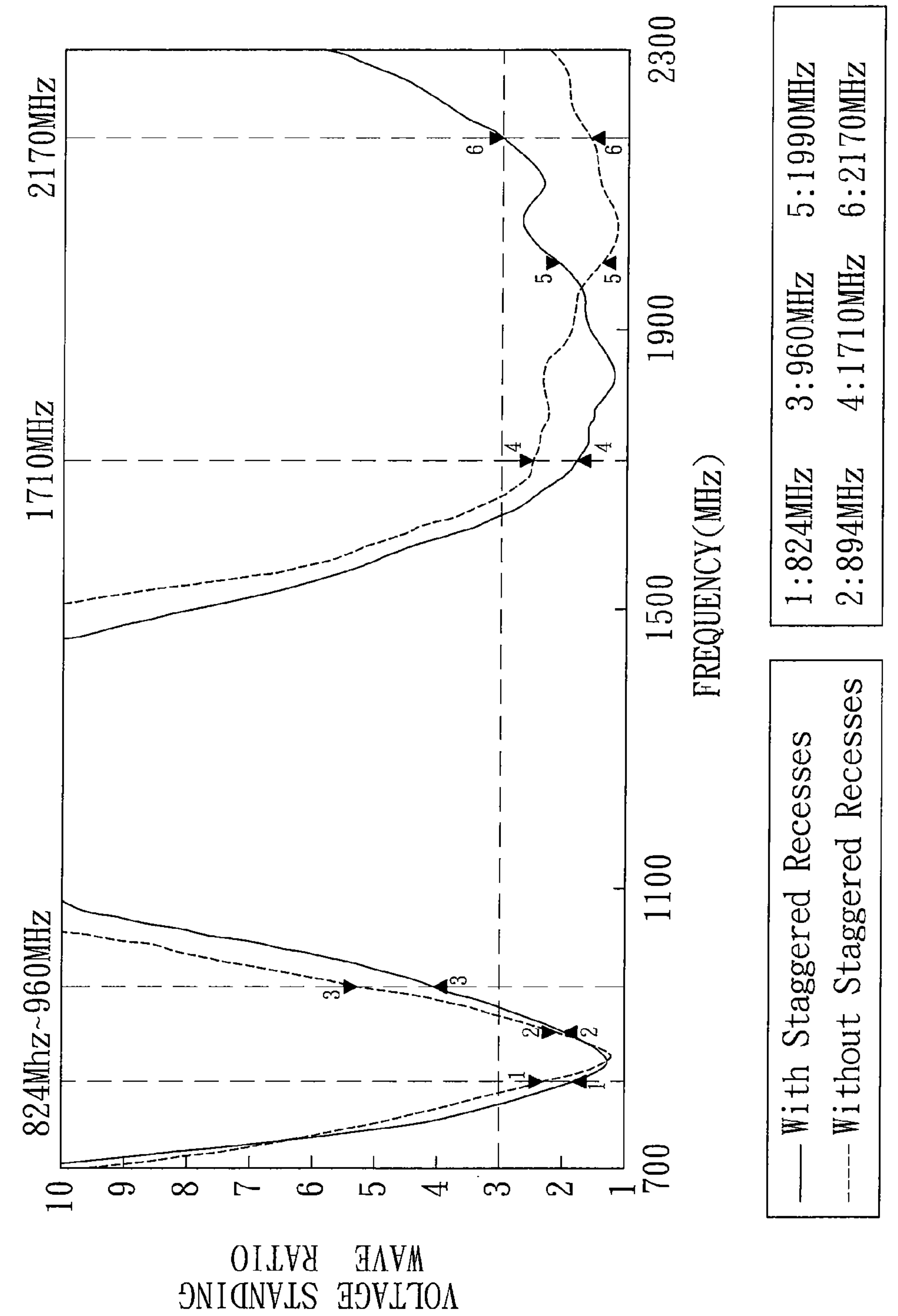
FIG. 8 is a Voltage Standing Wave Ratio (VSWR) plot showing VSWR curves of the communications device with a design of staggered recesses as shown in FIG. 4*a* and the same without the design of staggered recesses.

Referring to FIG. 8, a Voltage Standing Wave Ratio (VSWR) plot illustrates VSWR curves of the communications device 100 with the design of staggered recesses as shown in FIG. 4*a* and without the design of staggered recesses. It may be deduced from the VSWR plot that radiation efficiency of the communications device 100 with the design of staggered recesses of the present invention is relatively better than that of the conventional communications device without the design of staggered recesses at frequency bands ranging from 824 MHz to 894 MHz and from 1710 MHz to 1970 MHz.

Figure 9:
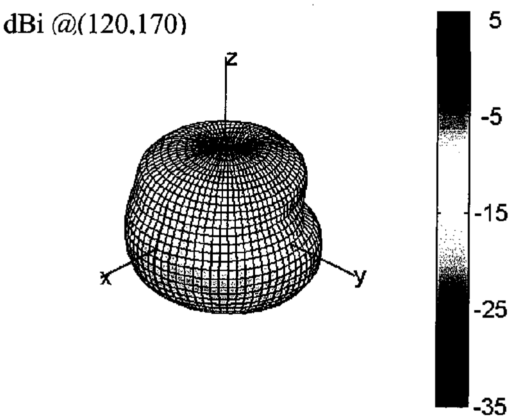
FIG. 9 illustrates radiation patterns of a communications device without first and second recesses operating at 849 MHz.
Figure 9:
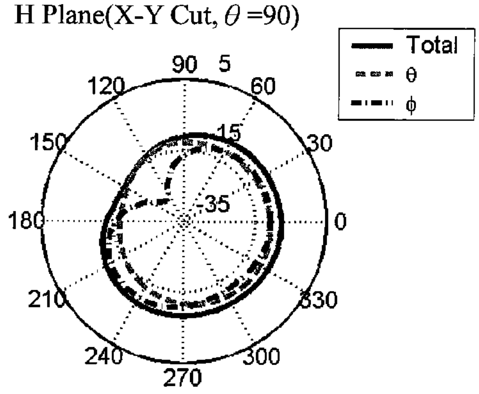
Figure 9:
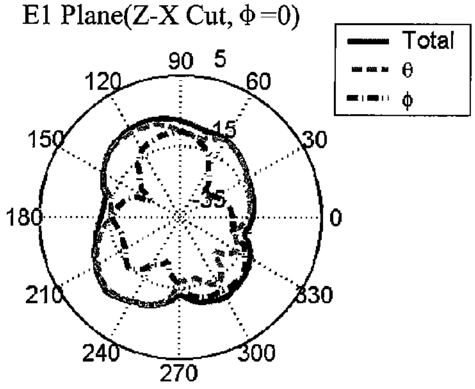
Figure 9:
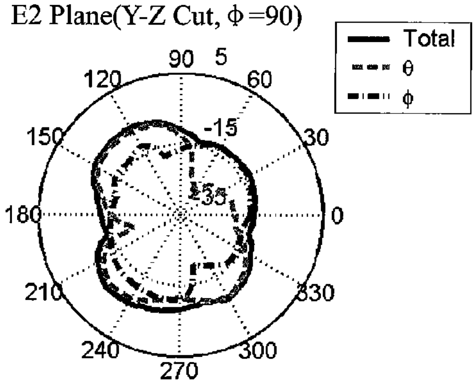
Figure 10:
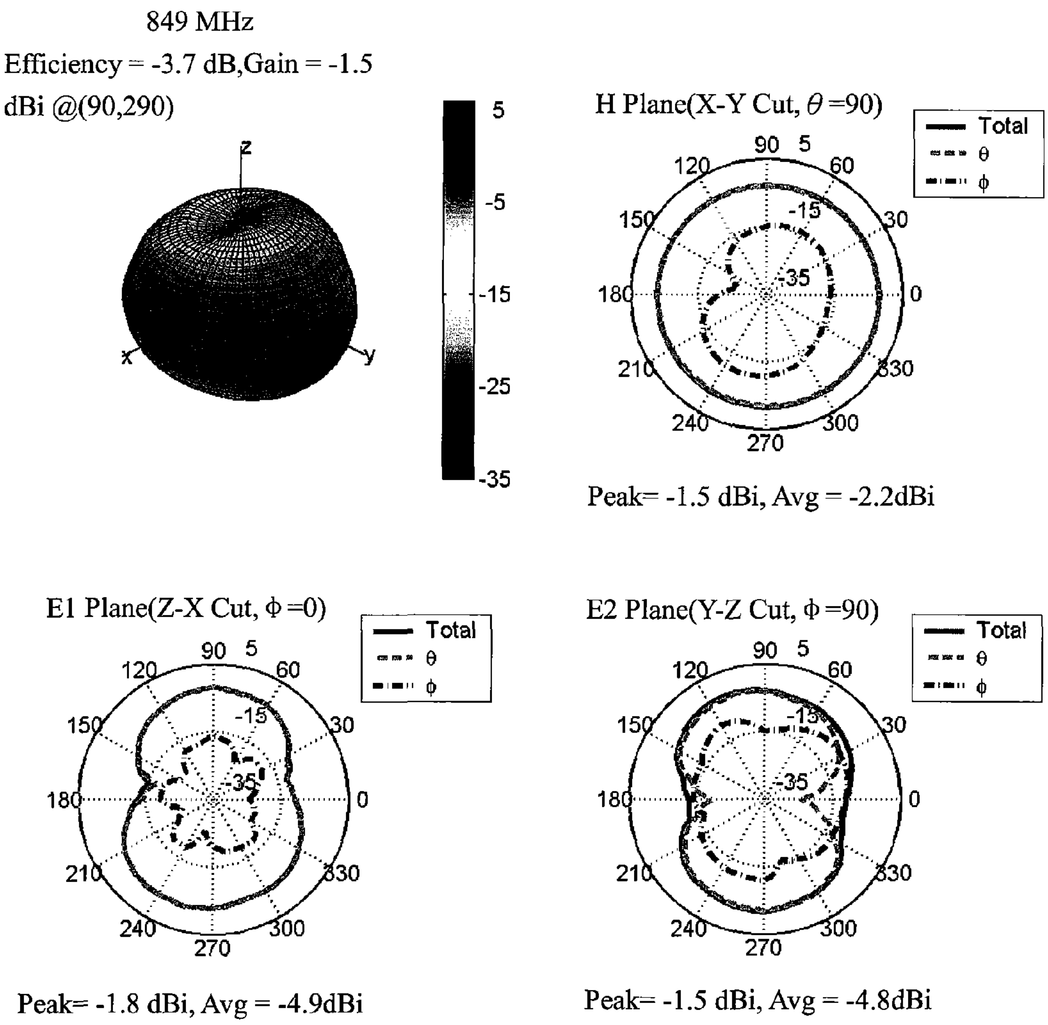
FIG. 10 illustrates radiation patterns of the communications device of the present invention operating at 849 MHz.

Referring to FIG. 9 and FIG. 10, upon comparing radiation patterns of the conventional communications device without the staggered recesses (FIG. 9) to those of the communications device 100 with the staggered recesses of the present invention (FIG. 10) operating at a frequency of 849 MHz, the latter one is much closer to a spherical shape than the former one, and thus has relatively better radiation efficiency.

Figure 11:
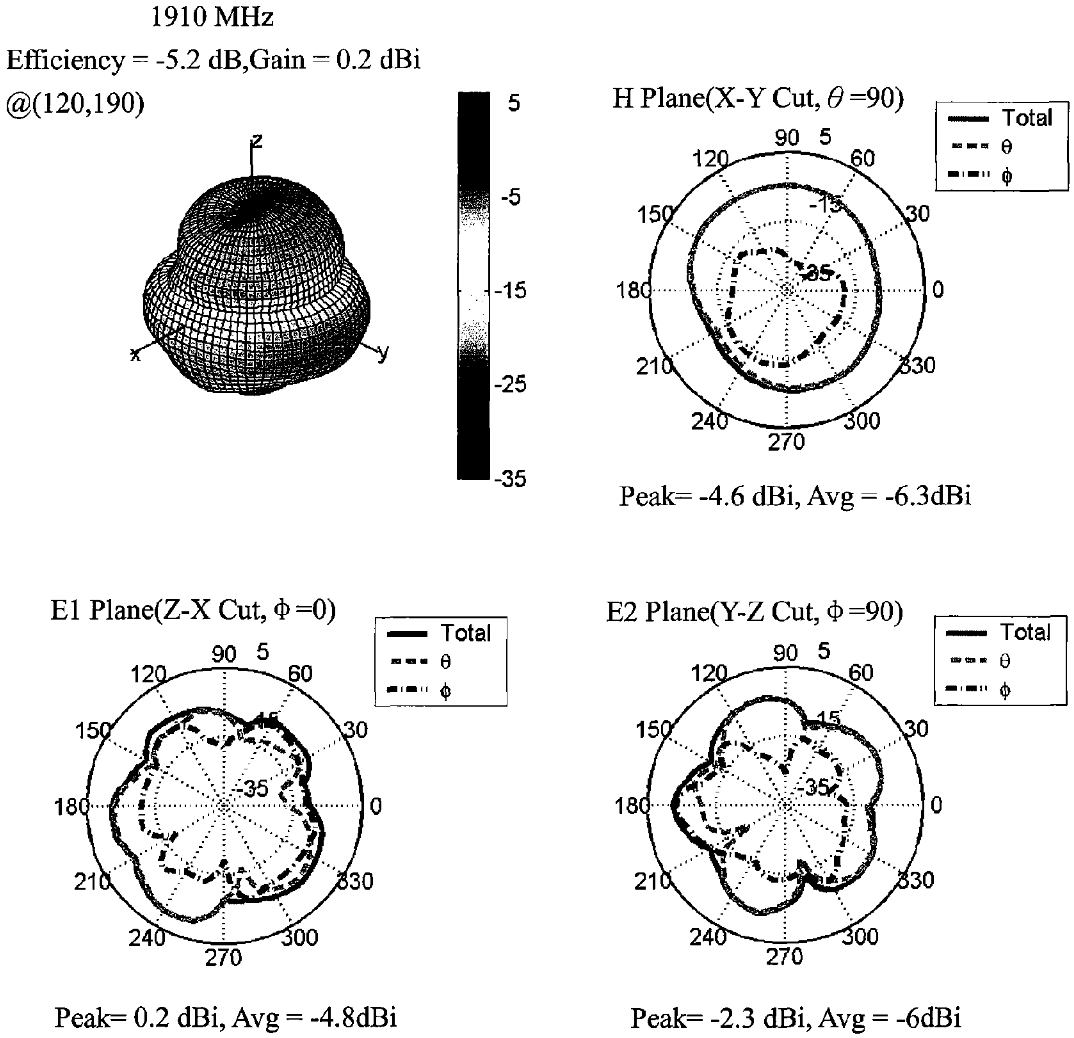
FIG. 11 illustrates radiation patterns of the communications device without the first and second recesses operating at 1910 MHz.
Figure 12:
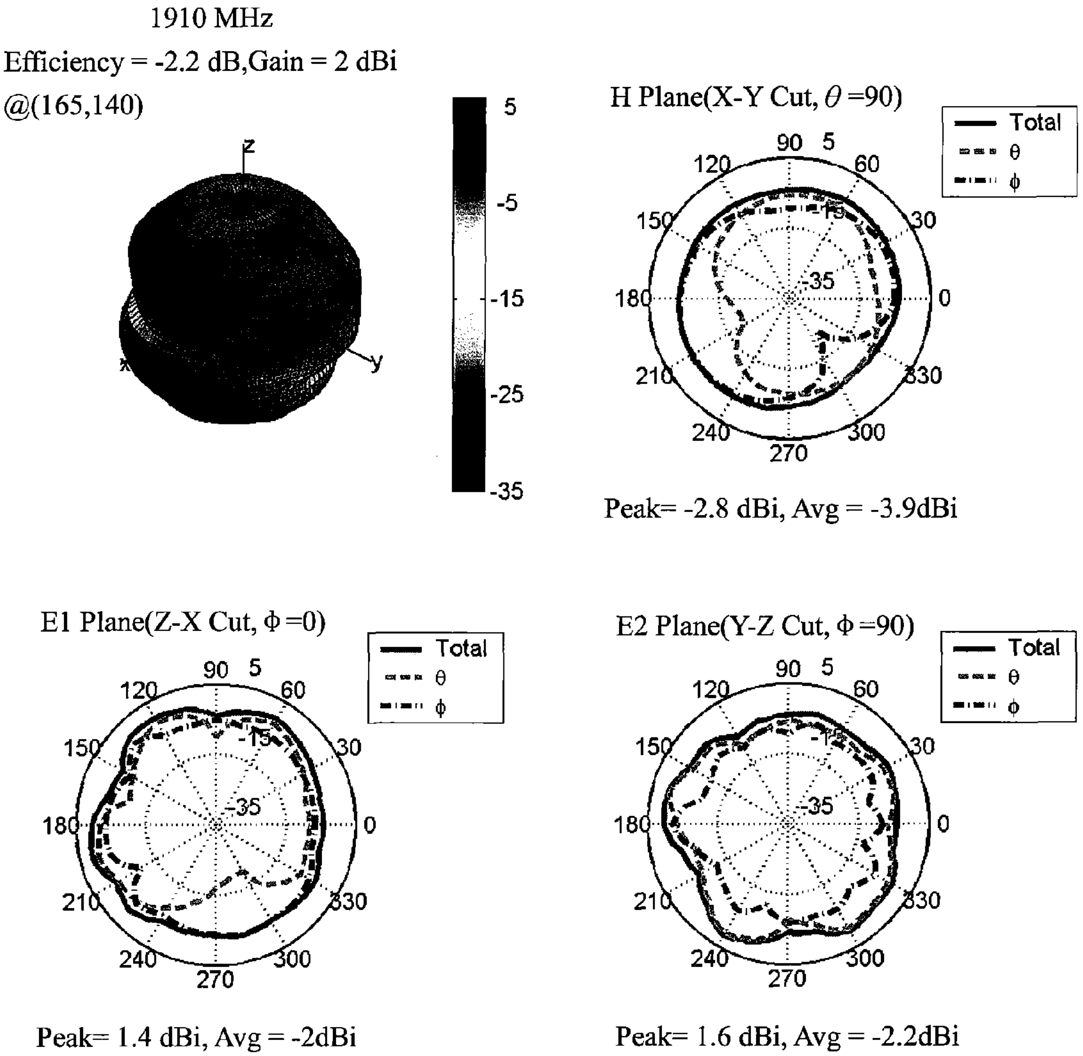
FIG. 12 illustrates radiation patterns of the communications device of the present invention operating at 1910 MHz.

Referring to FIG. 11 and FIG. 12, upon comparing radiation patterns of the conventional communications device without the staggered recesses (FIG. 11) to those of the communications device 100 with the staggered recesses of the present invention (FIG. 12) operating at a frequency of 1910 MHz, the latter one is much closer to a spherical shape than the former one, and thus has relatively better radiation efficiency.

In summary, the communications device 100 of the present invention may achieve an effect of coupling current reduction by the first recesses 211 that are staggered relative to the second recesses 111 when the second casing 1 is at the covering position such that the first metal layer part 21 is spaced farther apart from the second metal layer part 11 so as to reduce coupling current resulting from structures of two close metal layers. Moreover, the first non-metallic fillers 22 cooperate with the first metal layer part 21, and the second non-metallic fillers 12 cooperate with the second metal layer part 11 for maintaining structural strength of a corresponding one of the first and second casings 2, 1 of the communications device 100.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A communications device comprising:

a first casing;

a second casing coupled movably to said first casing, said second casing being movable relative to said first casing between a covering position and an uncovering position; and an antenna disposed in one of said first and second casings;

wherein said first casing includes a first metal layer part, said second casing includes a second metal layer part, and said antenna is adjacent to said first and second metal layer parts when said second casing is at the covering position;

wherein said first metal layer part has a surface that confronts said second metal layer part when said second casing is at the covering position and that is formed with a plurality of first recesses; and wherein said second metal layer part has a surface that confronts said first metal layer part when said second casing is at the covering position and that is formed with a plurality of second recesses;

wherein each of said first and second recesses has outer and inner sections respectively proximate to and distal from said surface of the corresponding one of said first and second metal layer parts, said outer section being wider than said inner section; geometric centers of adjacent ones of said first recesses are spaced apart by a distance not more than 0.25 $\lambda$ of a frequency at which said antenna operates, in which $\lambda$ is a wavelength of signals at the frequency, and geometric centers of adjacent ones of said second recesses are spaced apart by a distance not more than 0.25 $\lambda$ of the frequency.

2. The communications device as claimed in claim 1, wherein:

said first casing further includes a plurality of solid first non-metallic fillers, each filling a respective one of said first recesses; and said second casing further includes a plurality of solid second non-metallic fillers, each filling a respective one of said second recesses.

3. The communications device as claimed in claim 2, wherein said first and second non-metallic fillers are independently selected from plastic and ceramic.

4. The communications device as claimed in claim 2, wherein each of said first non-metallic fillers is flush with said surface of said first metal layer part, and each of said second non-metallic fillers is flush with said surface of said second metal layer part.

5. The communications device as claimed in claim 1, wherein each of said first and second recesses is independently selected from:

a recess having outer and inner sections respectively proximate to and distal from said surface of the corresponding one of said first and second metal layer parts, said outer section being wider than said inner section;

a concave recess;

a recess defined by a vee wall; and a recess defined by a substantially flat recess bottom and two inclined recess walls on opposite sides of said recess bottom.

6. The communications device as claimed in claim 1, wherein said first recesses are staggered relative to said second recesses when said second casing is at the covering position.

7. The communications device as claimed in claim 1, wherein said first recesses are staggered relative to said second recesses when said second casing is at the covering position.

8. The communications device as claimed in claim 7, wherein:

said first casing further includes a plurality of solid first non-metallic fillers, each filling a respective one of said first recesses; and said second casing further includes a plurality of solid second non-metallic fillers, each filling a respective one of said second recesses.

9. The communications device as claimed in claim 8, wherein said first and second non-metallic fillers are independently selected from plastic and ceramic.

10. The communications device as claimed in claim 9, wherein each of said first non-metallic fillers is flush with said surface of said first metal layer part, and each of said second non-metallic fillers is flush with said surface of said second metal layer part.

* * * * *